(12) United States Patent
Zan et al.

(10) Patent No.: US 9,331,294 B2
(45) Date of Patent: May 3, 2016

(54) VERTICAL ELECTRO-OPTICAL COMPONENT AND METHOD OF FABRICATING THE SAME

(71) Applicant: National Chiao Tung University, Hsinchu (TW)

(72) Inventors: Hsiao-Wen Zan, Hsinchu (TW); Hsin-Fei Meng, Hsinchu (TW); Wu-Wei Tsai, Hsinchu (TW); Yu-Chiang Chao, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 129 days.

(21) Appl. No.: 14/230,890

(22) Filed: Mar. 31, 2014

(65) Prior Publication Data

US 2014/0209883 A1    Jul. 31, 2014

Related U.S. Application Data

(62) Division of application No. 13/111,205, filed on May 19, 2011, now Pat. No. 8,723,165.

(30) Foreign Application Priority Data

Mar. 16, 2011   (TW) .............................. 100108872 A

(51) Int. Cl.
| | |
|---|---|
| *H01L 51/44* | (2006.01) |
| *H01L 51/05* | (2006.01) |
| *H01L 51/42* | (2006.01) |
| *H01L 51/52* | (2006.01) |

(52) U.S. Cl.
CPC ............ *H01L 51/442* (2013.01); *H01L 51/057* (2013.01); *H01L 51/4253* (2013.01); *H01L51/5215* (2013.01); *H01L 51/5234* (2013.01); *H01L 51/5296* (2013.01); *Y02E 10/549* (2013.01)

(58) Field of Classification Search
CPC ............. H01L 51/057; H01L 51/4253; H01L 51/5296; H01L 51/442; H01L 51/5215
USPC ................ 257/40, 43, 329, 133, 72, E51.012, 257/E51.018, E51.024; 438/24, 163, 5, 82, 438/99
See application file for complete search history.

(56) References Cited

U.S. PATENT DOCUMENTS

| | | | |
|---|---|---|---|
| 2011/0049502 A1 | 3/2011 | Jun et al. | |
| 2011/0284949 A1* | 11/2011 | Meng ................... | H01L 51/057 257/329 |
| 2014/0151669 A1* | 6/2014 | Oyamada ............ | H01L 51/5206 257/40 |

OTHER PUBLICATIONS

Zan et al., "Vertical polymer phototransistor featuring photomultiplication due to base-field shielding", Applied Physics Letters, vol. 98 (2011).
Hamilton et al., "Thin-Film Organic Polymer Phototransistors", IEEE Transactions on Electron Devices, vol. 51, No. 6, pp. 877-885 (2004).
Peumans et al., "Efficient, high-bandwidth organic multilayer photodetectors", Applied Physics Letters, vol. 76, No. 26, pp. 3855-3857 (2000).
Kudo et al., "Fabrication and device characterization of organic light emitting transistors", Thin Solid Films, pp. 330-333 (2003).
Kudo et al., "Organic light emitting transistors", Current Applied Physics, vol. 5, pp. 337-340 (2005).

* cited by examiner

*Primary Examiner* — Tran Tran
(74) *Attorney, Agent, or Firm* — Mintz Levin Cohn Ferris Glovsky and Popeo, P.C.; Peter F. Corless; Richard B. Emmons

(57) ABSTRACT

A vertical electro-optical component and a method for forming the same are provided. The vertical electro-optical component includes a substrate, a first electrode layer formed on the substrate, a patterned insulating layer formed on the first electrode layer, a metal layer formed on the patterned insulating layer, a semiconductor layer formed on the first electrode layer, and a second electrode layer formed on the semiconductor layer, wherein the semiconductor layer encapsulates the patterned insulating layer and the metal layer. The vertical electro-optical component thus has a low operational voltage of a vertical transistor and a high reaction speed of a photo diode, and may be used to form light-emitting transistors.

7 Claims, 6 Drawing Sheets

VERTICAL ELECTRO-OPTICAL COMPONENT AND METHOD OF FABRICATING THE SAME

CROSS REFERENCE TO RELATED APPLICATIONS

This application is a divisional of U.S. patent application Ser. No. 13/111,205, filed May 19, 2011, allowed, which claims priority to Taiwanese Patent Application Serial No. 100108872, filed Mar. 16, 2011; the entire disclosures of which are incorporated herein by reference in their entirety.

BACKGROUND OF THE INVENTION

1. Field of the Invention

This invention relates to electro-optical components, and, more particularly, to a vertical electro-optical component and a method of fabricating the same.

2. Description of Related Art

In semiconductor-based photodetectors, photons excite movable carriers, to generate currents. A general photodetector comprises transistors. A transistor is a three-terminal component, may amplify photoresponse signals, and has a significant regulation and photoresponsivity.

In order to improve the operational characteristics of the semiconductor itself, several prior arts are brought to the market.

M. C. Hamilton et al. disclosed in "IEEE Trans. Electron Devices, vol. 51, no. 6, pp. 877-885," published on June, 2004, a general three-terminal horizontal photo semiconductor. Although having a higher light sensitivity, the horizontal photo semiconductor has a lower overall response speed and a higher operational voltage (e.g., greater than 10 volts), as compared to a general photo diode, because its response involves the generation of defect states and the trap and relaxation of carriers and it cannot discompose excitons effectively.

P. Peumans et al. disclosed in "Appl. Phys. Lett. 76, 3855," published on 2000, a general photo diode. Though having a higher response speed, the photo diode has no advantage in circuit applications, since it is a two-terminal component.

K. Kudo et al. disclosed in "Thin Solid Films 438, 330," published on 2003, and K. Kudo disclosed in "Current Applied Physics 5, 337," published on 2005, a vertical light-emitting transistor, in which a gate is fabricated in a light-emitting layer. However, the steps of fabricating the mesh gate are complicated, and it is difficult to control the thickness of the gate layer. Too thick the gate layer may prevent currents from flowing from a source to a drain, while the gate cannot control the currents effectively if the gate layer is too thin. Accordingly, it is difficult to control the overall fabrication process, and the component is unstable.

U.S. Pat. No. 6,967,436B2 disclosed a display with a third electrode inserted therein. Since the third electrode is far from a light-emitting area, the light-emitting area thus has a potential that is difficult to be controlled, and performs a poor switching characteristic.

U.S. Pat. Nos. 7,633,084B2 and 7,126,153B2 disclosed embedding base metal into a semiconductor. Since no insulating layer is used that may prohibit the leakage currents between a base and an emitter or between the base and a collector, the transistor does not have a significant switching characteristic, and may suffer from a great power loss.

Therefore, in view of the problems of the prior art, to effectively and conveniently improve the component characteristics of a vertical electro-optical component, especially in increasing the reaction speed and reducing the operational voltage, in order to improve the efficiency of an electro-optical component, is becoming one of the most popular issues in the art.

SUMMARY OF THE INVENTION

In view of the above-mentioned problems of the prior art, the present invention provides a vertical electro-optical component, including: a substrate; a first electrode layer formed on the substrate; a patterned insulating layer formed on the first electrode layer; a metal layer formed on the patterned insulating layer; a semiconductor layer formed on the first electrode layer and encapsulating the patterned insulating layer and the metal layer; and a second electrode layer formed on the semiconductor layer.

In an embodiment of the present invention, the vertical electro-optical component further includes an insulating material layer formed on the metal layer, wherein the semiconductor layer further encapsulates the insulating material layer.

In an embodiment of the present invention, the vertical electro-optical component further includes a light-emitting layer disposed between the semiconductor layer and the second electrode layer.

In an embodiment of the present invention, the substrate may be made of glass, silicon or plastic, the first electrode layer may be made of ITO, fluorine-contained tin oxide (IFO), LiF/Al, Ca/Al, $MoO_3$/Al, Au, or LiF/Ag/CsF/Ag, the second electrode layer may be made of ITO, IFO, LiF/Al, Ca/Al, $MoO_3$/Al, Au, or LiF/Ag/CsF/Ag, the first electrode layer and the second electrode layer may be made of different materials, the patterned insulating layer may be made of PVP, PMMA, or PVA, the metal layer may be made of aluminum, titanium nitride or tantalum nitride, the semiconductor layer may be made of poly[3-hexylthiophene-2,5-diyl] of a p-type semiconductor or [6,6]-phenyl-C61-butyric acid methyl ester of an n-type semiconductor, or made of a compound constituted by poly[3-hexylthiophene-2,5-diyl of a p-type semiconductor and [6,6]-phenyl-C61-butyric acid methyl ester of an n-type semiconductor, and the insulating material layer is made of silicon oxide ($SiO_x$), aluminum oxide ($Al_2O_3$), or hafnium ($HfO_2$).

The present invention further provides a method of fabricating a vertical electro-optical component, including: providing a substrate on which a first electrode layer is formed; forming on the first electrode layer an insulating layer; forming on the insulating layer a patterned metal layer; removing the insulating layer that is not covered by the patterned metal layer, so as to form a patterned insulating layer; forming on the first electrode layer a semiconductor layer that encapsulates the patterned insulating layer and the patterned metal layer; and forming on the semiconductor layer a second electrode layer.

In an embodiment of the present invention, the patterned metal layer is formed by: forming on the insulating layer a patterned resist layer; forming the metal layer on the insulating layer and the patterned resist layer; and removing the metal layer on the patterned resist layer and the patterned resist layer.

In an embodiment of the present invention, the method further includes, before removing the metal layer on the patterned resist layer and the patterned resist layer, forming on the metal layer an insulating material layer, allowing the semiconductor layer to further encapsulate the insulating material layer.

In an embodiment of the present invention, the patterned metal layer is formed by: forming on the insulating layer the metal layer and the resist layer sequentially; imprinting the resist layer with a micro/nano imprint mold, so as to form the patterned resist layer; removing the metal layer that is not covered by the patterned resist layer; and removing the patterned resist layer.

In an embodiment of the present invention, the formation of the metal layer and the resist layer further comprises forming an insulating material layer between the metal layer and the resist layer, removing the metal layer further comprises removing the insulating material layer that is not covered by the patterned resist layer, and the formed semiconductor layer further encapsulates the insulating material layer.

In an embodiment of the present invention, the method further includes, before forming the second electrode layer, forming on the semiconductor layer a light-emitting layer disposed between the semiconductor layer and the second electrode layer.

In an embodiment of the present invention, the patterned resist layer may comprise a plurality of nano/micrometer balls.

In an embodiment of the present invention, the vertical electro-optical component further includes a light-emitting layer disposed between the semiconductor layer and the second electrode layer.

In an embodiment of the present invention, the substrate may be made of glass, silicon or plastic, the first electrode layer may be made of ITO, IFO, LiF/Al Ca/Al, $MoO_3$/Al, Au, or LiF/Ag/CsF/Ag, the second electrode layer may be made of ITO, fluorine-contained tin oxide, LiF/Al, Ca/Al, $MoO_3$/Al, Au, or LiF/Ag/CsF/Ag, the first electrode layer and the second electrode layer may be made of different materials, the patterned insulating layer may be made of PVP, PMMA, or PVA, the metal layer may be made of aluminum, titanium nitride or tantalum nitride, the semiconductor layer may be made of poly[3-hexylthiophene-2,5-diyl] of a p-type semiconductor or [6,6]-phenyl-C61-butyric acid methyl ester of an n-type semiconductor, or made of a compound constituted by poly[3-hexylthiophene-2,5-diyl of a p-type semiconductor and [6,6]-phenyl-C61-butyric acid methyl ester of an n-type semiconductor, and the insulating material layer is made of $SiO_x$, $Al_2O_3$, or $HfO_2$, but is not limited thereto.

In sum, in the present invention the conventional horizontal transistor is improved to be the vertical transistor which has a channel length less than 1 μm. In an embodiment of the present invention, the semiconductor layer may be made of a blend of a donor layer and an acceptor layer. Since having a very short channel, an vertical photodetector of the present invention can form an optical sensor that has a low operational voltage and high reaction speed. After the light-emitting layer is formed between the semiconductor layer and the second electrode layer, the present invention may also constitute a light-emitting transistor component.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

The First Embodiment

Figure 1A:
FIGS. 1A to 1H are cross-sectional views illustrating a vertical electro-optical component and a method of fabricating the same of a first embodiment according to the present invention, wherein FIGS. 1C' and 1D' illustrate another embodiment of FIGS. 1C and 1D, and FIGS. 1H' and 1H illustrate another embodiment.
Figure 1B:
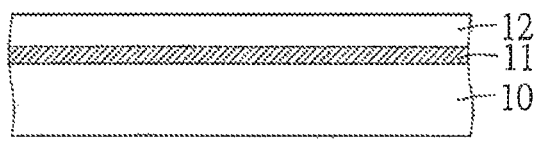
Figure 1C:
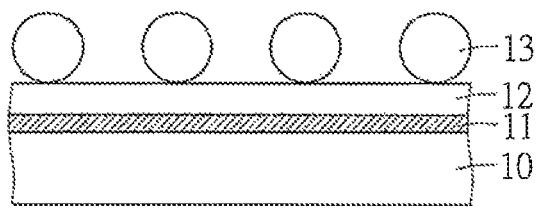
Figure 1D:
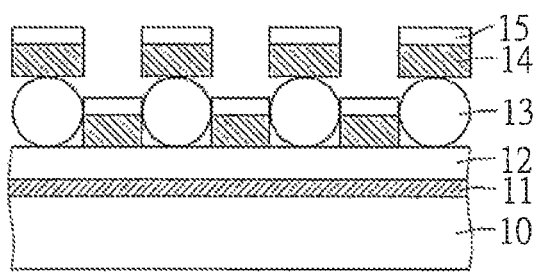
Figure 1C:
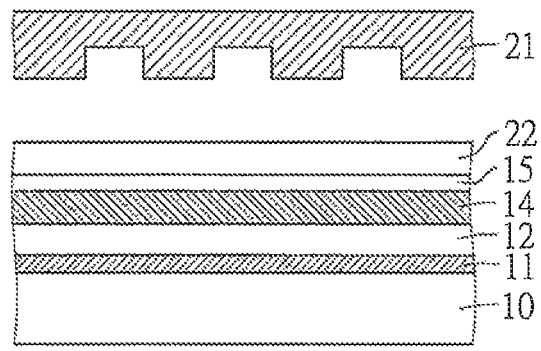
Figure 1D:
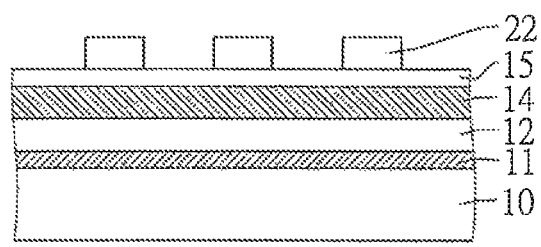
Figure 1E:
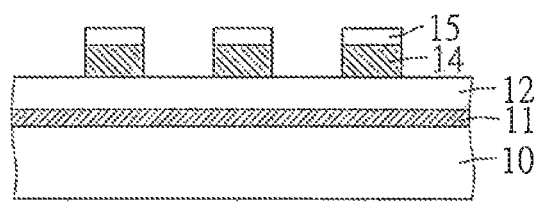
Figure 1F:
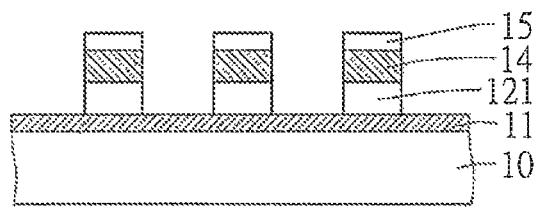
Figure 1G:
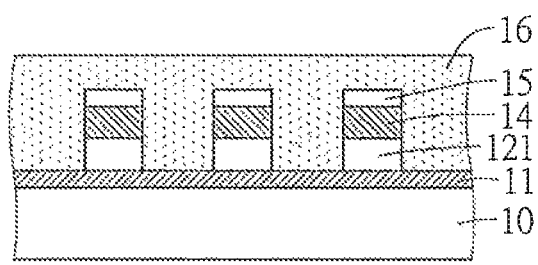
Figure 1H:
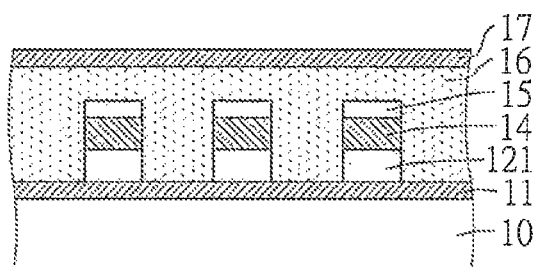
Figure 1H:
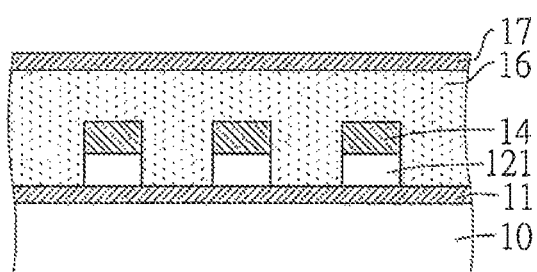

FIGS. 1A to 1H are cross-sectional views illustrating a vertical electro-optical component and a method of fabricating the same of a first embodiment according to the present invention, wherein FIGS. 1C' and 1D' illustrate another embodiment of FIGS. 1C and 1D, and FIGS. 1H' and 1H illustrate another embodiment.

As shown in FIG. 1A, a substrate 10 is provided, and a first electrode layer 11 is formed on the substrate 10. In an embodiment of the present invention, the substrate 10 may be made of glass, silicon, or plastic, and the first electrode layer 11 may be made of indium tin oxide (ITO), fluorine-contained tin oxide (IFO), LiF/Al, Ca/Al, $MoO_3$/Al, Au, or LiF/Ag/CsF/Ag.

As shown in FIG. 1B, an insulating layer 12 is formed on the first electrode layer 11. In an embodiment of the present invention, the insulating layer 12 is made of poly-(4-vinylphenol) (PVP), polymethylmethacrylate (PMMA), or polyvinyl alcohol (PVA), but is not limited thereto.

As shown in FIG. 1C, a patterned resist layer 13 is formed on the insulating layer 12. In an embodiment of the present invention, the patterned resist layer 13 comprises a plurality of nano/micrometer balls having a diameter of 200 nm, and the nano/micrometer balls are made of polystyrene (PS). In general, micro/nano ranges from 10-999 nm.

As shown in FIG. 1D, a metal layer 14 and an insulating material layer 15 are formed on the insulating layer 12 and the patterned resist layer 13. In an embodiment of the present invention, the metal layer 14 is made of aluminum, titanium nitride or tantalum nitride, and the insulating material layer 15 is made of $SiO_x$, $Al_2O_3$, or $HfO_2$, but is not limited thereto.

As shown in FIG. 1E, the patterned resist layer 13 and the metal layer 14 and the insulating material layer 15 thereon are removed.

Alternatively, as shown in FIGS. 1C', 1D' and 1E, the metal layer 14 and the insulating material layer 15 are formed on the insulating layer 12 sequentially; a resist layer 22 is formed on the insulating material layer 15; the resist layer 22 is imprinted with a micro/nano imprint mold 21, so as to constitute a patterned resist layer 22'; the metal layer 14 and the insulating material layer 15 that are not covered by the patterned resist layer 22' are removed; and the patterned resist layer 22' is removed.

As shown in FIG. 1F, the insulating layer 12 that is not covered by the metal layer 14 is removed by oxygen plasma, argon plasma or wet etching process, so as to constitute a patterned insulating layer 121.

As shown in FIG. 1G, a semiconductor layer 16 that encapsulates the patterned insulating layer 121, the metal layer 14 and the insulating material layer 15 is formed on the first electrode layer 11. In an embodiment of the present invention, the semiconductor layer 16 is made of a compound of poly [3-hexylthiophene-2,5-diyl] (P3HT) of a p-type semiconductor and [6,6]-phenyl-C61-butyric acid methyl ester (PCBM) of an n-type semiconductor.

As shown in FIG. 1H, a second electrode layer 17 is formed on the semiconductor layer 16. In an embodiment of the present invention, the second electrode layer 17 is made of aluminum, indium tin oxide (ITO), fluorine-contained tin oxide (IFO), LiF/Al, Ca/Al, MoO$_3$/Al, Au, or LiF/Ag/CsF/Ag. In another embodiment of the present invention, the insulating material layer 15 may not be formed, as shown in FIG. 1H'.

According to the previously-mentioned method, the embodiment discloses a vertical electro-optical component, which comprises: a substrate 10; a first electrode layer 11 formed on the substrate 10; a patterned insulating layer 121 formed on the first electrode layer 11; a metal layer 14 formed on the patterned insulating layer 121; a semiconductor layer 16 formed on the first electrode layer 11 and encapsulating the patterned insulating layer 121 and the metal layer 14; and a second electrode layer 17 formed on the semiconductor layer 16.

In an embodiment of the present invention, the vertical electro-optical component further comprises an insulating material layer 15 formed on the metal layer 14, and the semiconductor layer 16 further encapsulates the insulating material layer 15.

In the vertical electro-optical component, the substrate 10 may be made of glass, silicon or plastic; the first electrode layer 11 made be made of ITO, fluorine-contained tin oxide (IFO), LiF/Al, Ca/Al, MoO$_3$/Al, Au, or LiF/Ag/CsF/Ag; the second electrode layer 17 may be made of aluminum, ITO, fluorine-contained tin oxide, LiF/Al, Ca/Al, MoO$_3$/Al, Au, or LiF/Ag/CsF/Ag; the patterned insulating layer 121 may be made of poly-(4-vinylphenol) (PVP), polymethylmethacrylate (PMMA), or polyvinyl alcohol (PVA), but is not limited thereto; the metal layer 14 may be made of aluminum, titanium nitride or tantalum nitride; and the insulating material layer 15 may be made of silicon oxide (SiOx), aluminum oxide (Al$_2$O$_3$), or hafnium oxide (HfO$_2$), but is not limited thereto.

In an embodiment of the present invention, the vertical electro-optical component is a light-sensing transistor component, in which the first electrode layer 11, the metal layer 14 and the second electrode layer 17 are an emitter, a base and a collector, respectively, or the first electrode layer 11, the metal layer 14 and the second electrode layer 17 are a collector, a base and an emitter, respectively; and the semiconductor layer 16 is made a compound constituted by poly[3-hexylthiophene-2,5-diyl] (P3HT) and [6,6]-phenyl-C61-butyric acid methyl ester (PCBM), the compound blending a donor layer (e.g., P3HT) and an acceptor layer (e.g., PCBM), such that the excitons may be detached effectively, the operational voltage of the transistor component is reduced, and the response speed of the transistor component is increased.

Figure 2:
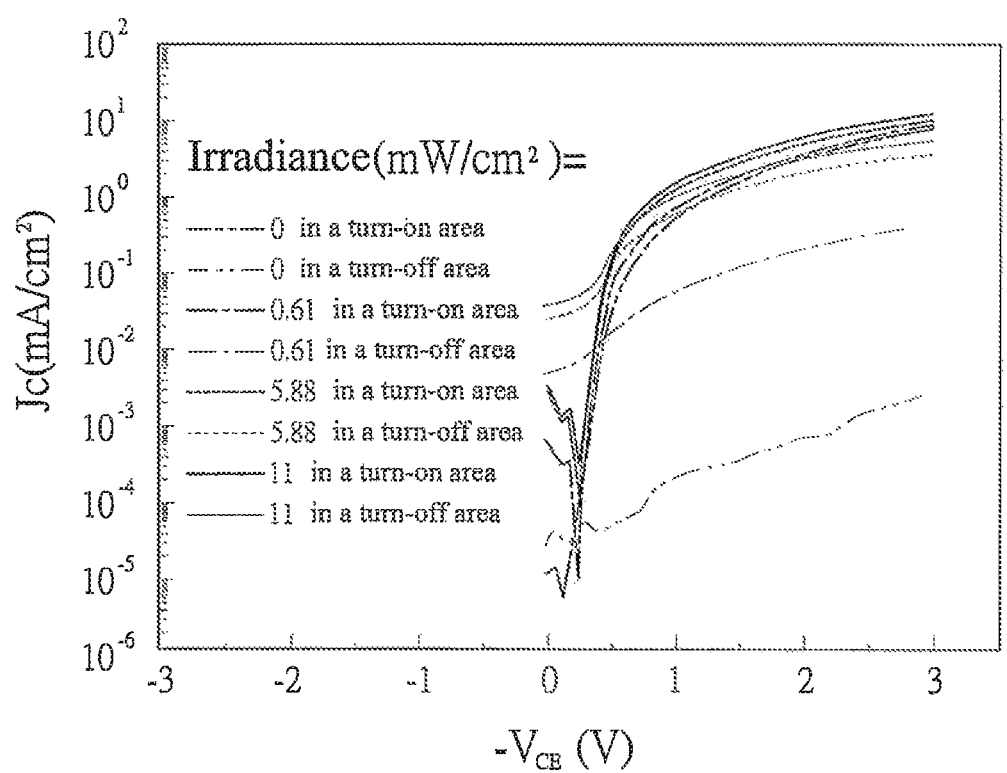
FIG. 2 shows a relation diagram between an output current density and operational voltage of a vertical electro-optical component according to the present invention.

When light is emitted via the substrate 10 onto the first electrode layer 11, currents are generated on the second electrode layer 17. A relation between the current density $J_C$ and the operational voltage $V_{CE}$ of the currents is shown in FIG. 2, in which the substrate 10 is made of glass, the first electrode layer 11 is made of ITO and is 200 nanometers thick, the patterned insulating layer 121 is made of PVP and is 200 nanometers thick, the metal layer 14 is made of aluminum and is 40 nanometers thick, the insulating material layer 15 is made of SiOx and is 50 nanometers thick, the semiconductor layer 16 is made of a compound constituted by P3HT and PCBM (P3HT; PCBM=1:0.1 (wt %:wt %)) and is 350 nanometers thick, the second electrode layer 17 is made of aluminum and is 40 nanometers thick, a thick line represents that the light-sensing transistor component is operating in a turn-on area ($V_{BE}$ is −0.9V), and a thin line represents that the light-sensing transistor component is operating in a turn-off area ($V_{BE}$ is 1.5V). It can be known from FIG. 2 that, as the irradiance increases from 0 to 11 mW/cm$^2$, the current density in the turn-off area increases significantly and has an order of magnitude approximately equal to that of the current density in the turn-on area. Therefore, if the transistor component is operating in the turn-off area, the current difference among various illumination intensities may be differentiated, and the transistor component may become an optical sensor having a low operational voltage ($V_{CE}$ is approximately equal to −3V).

Figure 3:
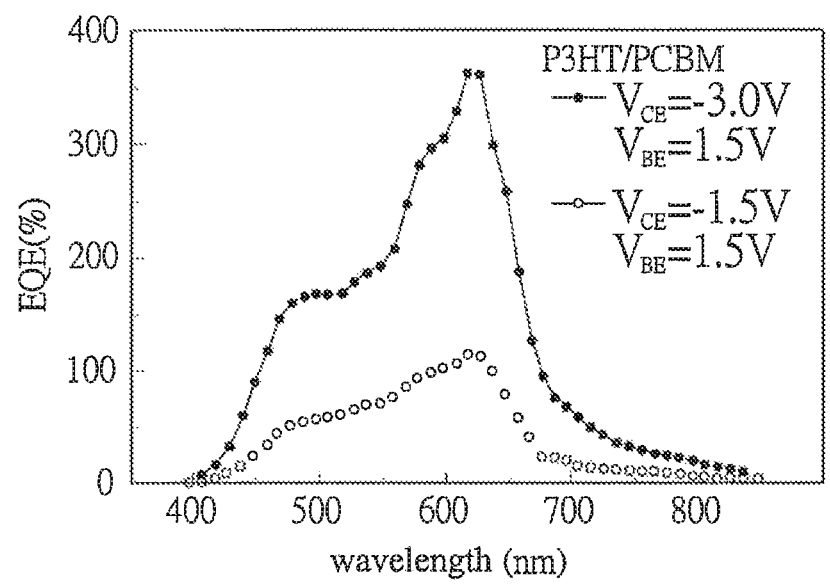
FIG. 3 shows a relation diagram between external quantum efficiency and incident light wavelength of a vertical electro-optical component according to the present invention.

As shown in FIG. 3, experiments show that, when the operational voltage $V_{CE}$ is equal to −3V or −1.5V and $V_{BE}$ is equal to 1.5V, the transistor component may have an external quantum efficiency (EQE) greater than 100.

The Second Embodiment

Figure 4A:
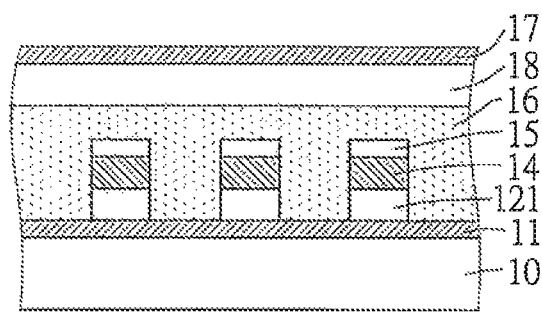
FIGS. 4A and 4B are cross-sectional views illustrating a vertical electro-optical component of a second embodiment according to the present invention.
Figure 4B:
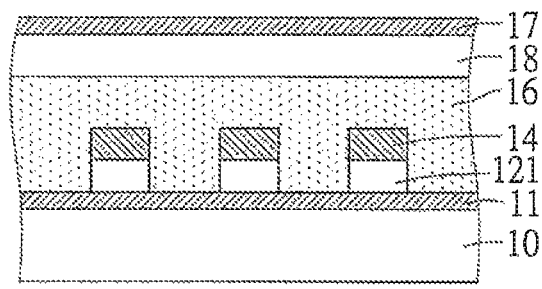

Please refer to FIGS. 4A and 4B, which are cross-sectional diagrams of a vertical electro-optical component of a second embodiment according to the present invention.

FIGS. 4A and 4B correspond to FIGS. 1H and 1H', respectively. The second embodiment differs from the first embodiment in that the second embodiment, during the processes of FIGS. 1H and 1H', further forms a light-emitting layer (EML) 18 between the semiconductor layer 16 and the second electrode layer 17, making the present invention become a light-emitting transistor component.

In the second embodiment, the first electrode layer 11 and the second electrode layer 17 are a cathode, and an anode, respectively. Alternatively, the first electrode layer 11 and the second electrode layer 17 may be an anode and a cathode, respectively. In an embodiment of the present invention, the semiconductor layer 16 may be a p-type semiconductor or an n-type semiconductor, the light-emitting layer 18 may emit light upward, making the light to be emitted via the transparent second electrode layer 17, or the light-emitting layer 18 may emit light downward, making the light to be emitted via the transparent first electrode layer 11. Of course, the light-emitting layer 18 may emit light upward and downward.

The second embodiment further discloses another vertical electro-optical component, which comprises: a substrate 10; a first electrode layer 11 formed on the substrate 10; a patterned insulating layer 121 formed on the first electrode layer 11; a metal layer 14 formed on the patterned insulating layer 121; a semiconductor layer 16 formed on the first electrode layer 11 and encapsulating the patterned insulating layer 121 and the metal layer 14; a second electrode layer 17 formed on the semiconductor layer 16; and a light-emitting layer 18 formed between the semiconductor layer 16 and the second electrode layer 17.

In an embodiment of the present invention, the vertical electro-optical component further comprises an insulating material layer 15 formed on the metal layer 14, and the semiconductor layer 16 further encapsulates the insulating material layer 15.

In an embodiment of the present invention, the substrate 10 is made of glass, silicon, or plastic; the first electrode layer 11 is made of ITO, fluorine-contained tin oxide, LiF/Al, Ca/Al, MoO$_3$/Al, Au, or LiF/Ag/CsF/Ag; and the second electrode layer 17 is made of aluminum, ITO, fluorine-contained tin oxide, LiF/Al, Ca/Al, MoO$_3$/Al, Au, or LiF/Ag/CsF/Ag. In an embodiment of the present invention, the first electrode layer 11 and the second electrode layer 17 are made of different materials. The selection of electrodes depends on the type of the vertical electro-optical component. For instance, if the vertical electro-optical component emits light downward, a bottom electrode (the first electrode layer 11) must be a transparent electrode such as ITO or fluorine-contained tin oxide, and a top electrode (the second electrode layer 17) must be a non-transparent electrode such as MoO$_3$/Al, LiF/Al, or Ca/Al; if the vertical electro-optical component emits light in any direction, the top and bottom electrodes may be both transparent electrodes.

In an embodiment of the present invention, the patterned insulating layer 121 is made of poly-(4-vinylphenol) (PVP), polymethylmethacrylate (PMMA), or polyvinyl alcohol (PVA); the metal layer 14 is made of aluminum, titanium nitride or tantalum nitride; and the insulating material layer 15 is made of SiOx, Al$_2$O$_3$, or HfO$_2$.

In an embodiment of the present invention, when the vertical electro-optical component acts as an optical sensor, the selected semiconductor layer 16 is a compound of a p-type semiconductor and an n-type semiconductor, such as P3HT (p-type semiconductor) and PCBM (n-type semiconductor) in the first embodiment; when the vertical electro-optical component acts as a light-emitting transistor, the selected semiconductor layer 16 may be a p-type semiconductor or an n-type semiconductor, and is not a compound thereof.

In sum, the present invention improves the conventional horizontal transistor to be a vertical transistor that uses the thickness of a semiconductor layer to define the channel length of a semiconductor component to be less than 1 µm, which cannot be achieved by the horizontal transistor unless the horizontal transistor is fabricated by a very expensive fabrication technique. In the optical sensor field, the semiconductor layer of the present invention is made of a compound constituted by a donor layer and an acceptor layer. Therefore, the vertical photodetector of the present invention combines the advantages of the low operational voltage of the vertical transistor and the high reaction speed of the photo diode. Also, the present invention has other advantages such as a low cost and a higher external quantum efficiency. Since a light-emitting layer may be formed between the semiconductor layer and the second electrode layer, the present invention may be applied to a light-emitting component (light-emitting transistor) field.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A vertical electro-optical component, comprising:
   a substrate;
   a first electrode layer formed on the substrate;
   a patterned insulating layer formed on the first electrode layer;
   a metal layer formed on the patterned insulating layer;
   a semiconductor layer formed on the first electrode layer and encapsulating the patterned insulating layer and the metal layer, wherein the semiconductor layer is made of poly[3-hexylthiophene-2,5-diyl] of a p-type semiconductor or [6,6]-phenyl-C61-butyric acid methyl ester of an n-type semiconductor, or made of a mixture constituted by poly[3-hexylthiophene-2,5-diyl] of a p-type semiconductor and [6,6]-phenyl-C61-butyric acid methyl ester of an n-type semiconductor; and
   a second electrode layer formed on the semiconductor layer.

2. The vertical electro-optical component of claim 1, further comprising an insulating material layer formed on the metal layer, allowing the semiconductor layer to further encapsulate the insulating material layer.

3. The vertical electro-optical component of claim 2, wherein the insulating material layer is made of silicon oxide (SiO$_x$), aluminum oxide (Al$_2$O$_3$), or hafnium oxide (HfO$_2$).

4. The vertical electro-optical component of claim 1, further comprising a light-emitting layer formed between the semiconductor layer and the second electrode layer.

5. The vertical electro-optical component of claim 1, wherein the first electrode layer is made of indium tin oxide (ITO), fluorine-contained tin oxide (IFO), LiF/Al, Ca/Al, MoO$_3$/Al, Au, or LiF/Ag/CsF/Ag, and the second electrode layer is made of ITO, IFO, LiF/Al, Ca/Al, MoO$_3$/Al, Au, or LiF/Ag/CsF/Ag.

6. The vertical electro-optical component of claim 1, wherein the patterned insulating layer is made of poly-(4-vinylphenol), Polymethylmethacrylate (PMMA), or Polyvinyl Alcohol (PVA).

7. The vertical electro-optical component of claim 1, wherein the metal layer is made of aluminum, titanium nitride or tantalum nitride.

* * * * *